(12) United States Patent
Ikenaga et al.

(10) Patent No.: US 8,004,348 B2
(45) Date of Patent: Aug. 23, 2011

(54) SEMICONDUCTOR CIRCUIT DEVICE CONTROLLING POWER SOURCE VOLTAGE

(75) Inventors: Yoshifumi Ikenaga, Tokyo (JP);
Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 18 days.

(21) Appl. No.: 12/526,988

(22) PCT Filed: Feb. 14, 2008

(86) PCT No.: PCT/JP2008/052434
§ 371 (c)(1),
(2), (4) Date: Aug. 13, 2009

(87) PCT Pub. No.: WO2008/099878
PCT Pub. Date: Aug. 21, 2008

(65) Prior Publication Data
US 2010/0033235 A1 Feb. 11, 2010

(30) Foreign Application Priority Data
Feb. 14, 2007 (JP) .................. 2007-033450

(51) Int. Cl.
*G05F 1/10* (2006.01)
(52) U.S. Cl. ..................................... 327/540
(58) Field of Classification Search .................. 327/534, 327/535, 538, 540, 541
See application file for complete search history.

(56) References Cited

U.S. PATENT DOCUMENTS

| 6,313,622 | B1 | 11/2001 | Seki et al. | |
| 6,414,527 | B1 * | 7/2002 | Seno et al. | 327/158 |
| 6,667,651 | B2 * | 12/2003 | Hashiguchi | 327/538 |
| 7,501,868 | B2 * | 3/2009 | Ito | 327/158 |
| 7,755,418 | B2 * | 7/2010 | Hosier | 327/538 |

FOREIGN PATENT DOCUMENTS

| JP | 2000216337 A | 8/2000 |
| JP | 2000216338 A | 8/2000 |
| JP | 2001244421 A | 9/2001 |
| JP | 2003330549 A | 11/2003 |
| JP | 2005141757 A | 6/2005 |
| JP | 2005340426 A | 12/2005 |

OTHER PUBLICATIONS

Chinese Office Action for CN200880005224.4 issued May 11, 2010.
International Search Report for PCT/JP2008/052434 mailed May 20, 2008.

* cited by examiner

*Primary Examiner* — Jeffrey S Zweizig

(57) ABSTRACT

A control circuit controls a power-source-voltage feed circuit, and controls a power source voltage fed to a target circuit. A reference-speed monitor monitors whether or not a delay time of a critical path in the target circuit is satisfies a required operational speed. A voltage-difference monitor monitors a difference between the power source voltage of the target circuit and a threshold voltage of the target circuit, to output the voltage difference information. The control circuit determines whether to increase or decrease the power source voltage based on a result of monitoring by the reference-speed monitor. The control circuit determines the change rate of the power source voltage so that the control rate of the power source voltage is proportional to the voltage difference information output from the voltage-difference monitor.

22 Claims, 12 Drawing Sheets

SEMICONDUCTOR CIRCUIT DEVICE CONTROLLING POWER SOURCE VOLTAGE

This application is the National Phase of PCT/JP2008/052434, filed Feb. 14, 2008, which is based upon and claims the benefit of priority from Japanese patent application No. 2007-033450 filed on Feb. 14, 2007, the disclosure of which is incorporated herein in its entirety by reference.

TECHNICAL FIELD

The present invention relates to a semiconductor integrated circuit device and, more particularly, to a semiconductor integrated circuit device that performs control of a power source voltage in order to guarantee the speed and/or reduce the power dissipation of the semiconductor integrated circuit device.

BACKGROUND ART

In a semiconductor integrated circuit device using a CMOS logic gate, as a technique for reducing the power dissipation, it is effective to use "dynamic voltage and frequency scaling (DVFS)" that controls the power source voltage depending on the speed required thereof. In the case of using the DVFS, in order to enhance the effect of reducing the power dissipation, it is needed to control the power source voltage in a possible shortest period of time with a possible highest accuracy, after the required operational speed (clock frequency) is changed.

As the techniques for the power-source-voltage control in the DVFS, there is a technique that controls the voltage in accordance with the result of comparison between the operational speed of the circuit and the required operational speed while using a speed monitor, as described in JP-2001-244421A. In the same publication, there is also a description that a conversion table between the power source voltage and the operational speed is prepared in advance, and the circuit immediately shifts to an optimum power source voltage in accordance with the required operational speed.

In order to change the power source voltage to the optimum voltage within a short period of time, it is needed to accelerate the rate of changing the power source voltage, i.e., power-source-voltage control rate. However, an excessively higher power-source-voltage control rate, if employed, delays the feedback from the speed monitor to the power-source-voltage control circuit, such as a regulator, whereby the controlled power source voltage may oscillate in the vicinity of the optimum voltage, and may delay the convergence to the optimum voltage. Or else, the convergence may not be achieved.

On the other hand, a lower power-source-voltage control rate, if employed, prolongs the time length needed for control of the power source voltage to the optimum voltage after the change of speed if the operational speed is largely changed, i.e., the difference between the optimum voltages is larger.

In JP-2001-244421A, the above problem is solved by controlling the power-source-voltage control rate based on the result of comparison with the reference speed by the speed monitor. However, in this technique, the main object thereof is to reduce the time length during which the operational speed is insufficient, by rapidly increasing the power source voltage if the power source voltage is lower than the minimum voltage that is required of the power source voltage. Thus, it is impossible to satisfy the request of controlling to the optimum voltage with a higher accuracy. In the case of controlling the change rate of the power source voltage based on the conversion table, there is also the problem that a larger number of conversion tables are needed in advance corresponding to the difference in the environment, such as the temperature.

SUMMARY OF THE INVENTION

It is an object of the present invention to solve the above problems of the conventional technique and to provide a semiconductor integrated circuit device that is capable of controlling the power source voltage to a desired voltage within a short period of time, with a higher accuracy, and without preparing in advance the power-source-voltage dependency of the operational speed of the circuit.

The present invention provides a semiconductor integrated circuit device including: a target circuit for which at least a power source voltage is variable; a voltage feed circuit that feeds the power source voltage to the target circuit; a control circuit that controls the power source voltage fed by the voltage feed circuit, wherein the control circuit increases or decreases the power source voltage, which the voltage feed circuit feeds to the target circuit, at a change rate corresponding to an operational speed in the target circuit.

The above and other objects, features and advantages of the present invention will be more apparent from the following description, referring to the drawings.

DETAILED DESCRIPTION OF THE INVENTION

Hereinafter, exemplary embodiments of the present invention will be described in detail with reference to the drawings.

Figure 1:
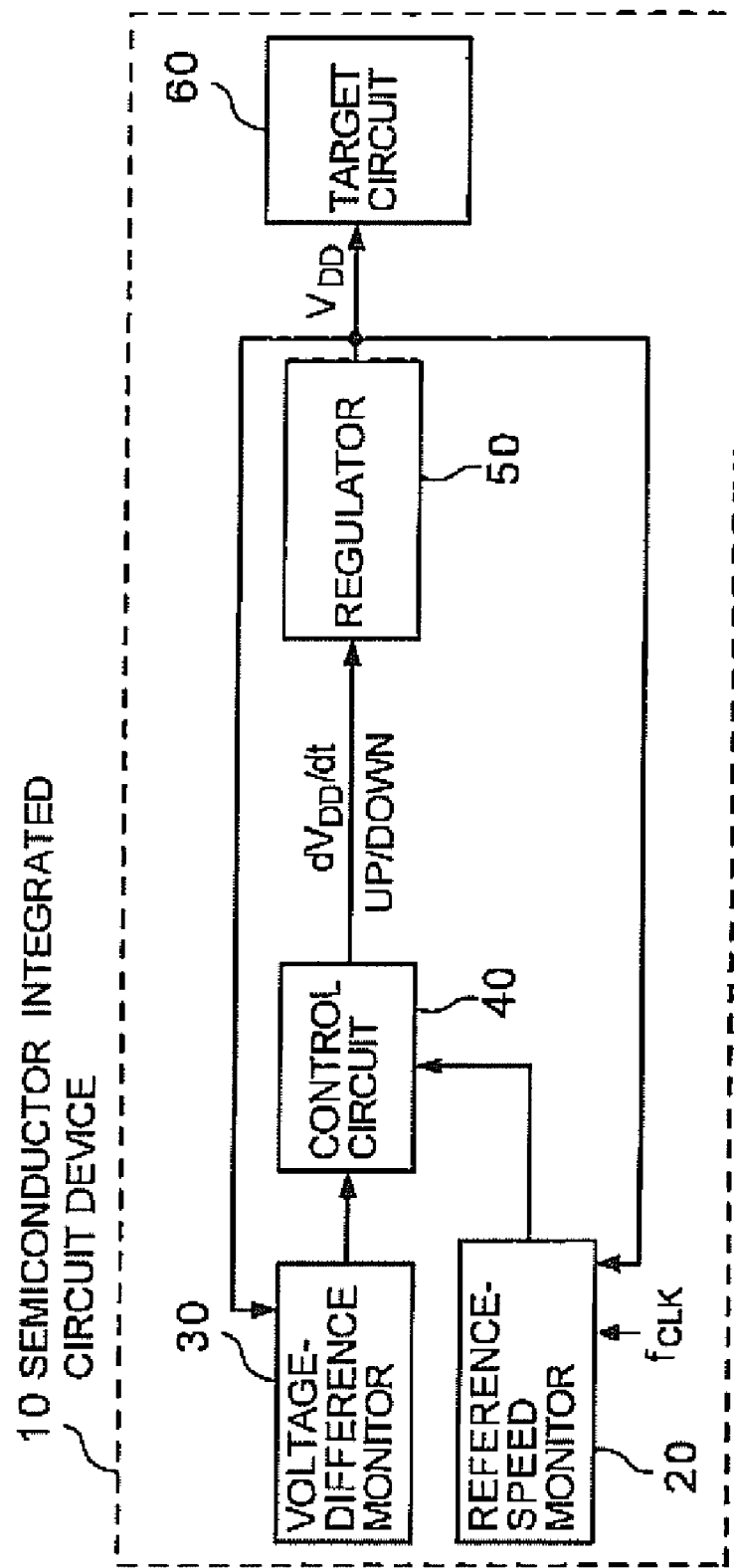
FIG. 1 is a block diagram showing the configuration of a semiconductor integrated circuit device according to a first embodiment of the present invention.

FIG. 1 shows the configuration of a semiconductor integrated circuit device according to a first embodiment of the present invention. The semiconductor integrated circuit device 10 includes a reference-speed monitor 20, a voltage-difference monitor 30, a control circuit 40, and a power-source-voltage feed circuit (regulator) 50. The power-source-voltage feed circuit 50 generates a power source voltage for a target circuit 60 that is a target for which the power source voltage is controlled. The reference-speed monitor 20 includes a replica of the critical path of the target circuit 60, and uses the replica to compare the operational speed of the target circuit 60 against the required operational speed. The voltage-difference monitor 30 outputs voltage difference information corresponding to the difference between the power source voltage and the threshold voltage of the target circuit 60.

The control circuit 40 controls the power source voltage fed to the target circuit 60 based on the output of the reference-speed monitor 20 and voltage-difference monitor 30. More specifically, the control circuit 40 determines the control direction of the power source voltage, i.e., whether to increase or decrease the operational speed, depending on the result of comparison between the operational speed of the target circuit 60 in the reference-speed monitor 20 against the required operational speed. The control circuit 40 also determines, based on the voltage difference information output from the voltage-difference monitor 30, the change rate of the power source voltage, i.e., power-source-voltage control rate upon increasing or decreasing the power source voltage.

Figure 2:
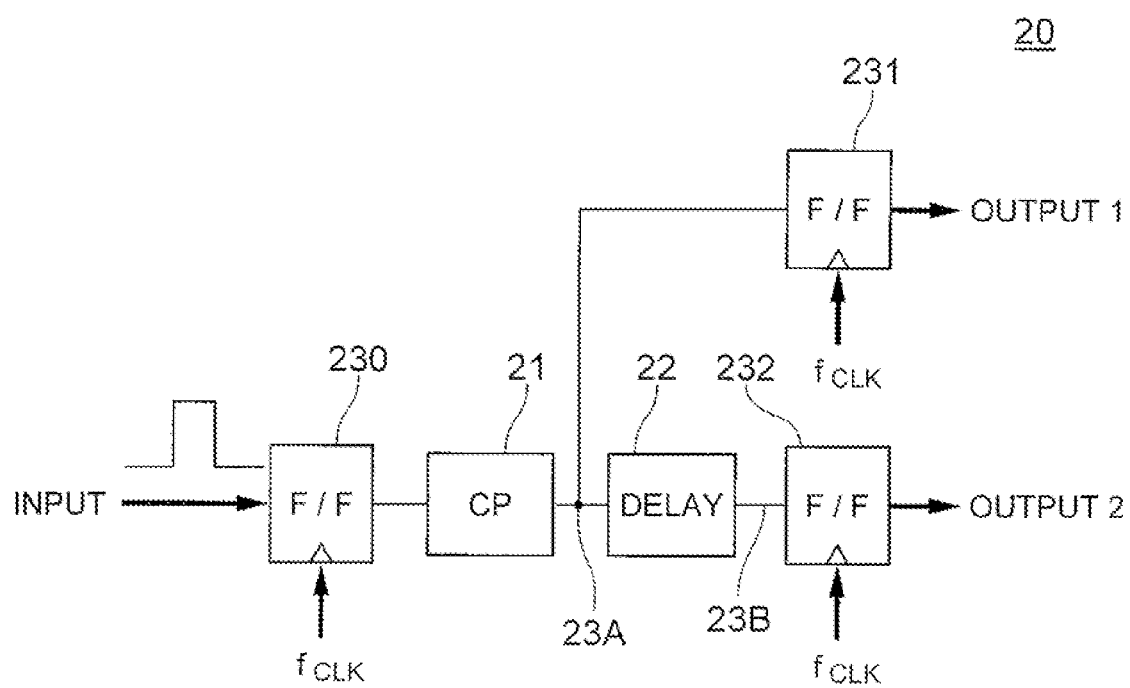
FIG. 2 is a block diagram showing the configuration of the reference-speed monitor.

FIG. 2 shows the circuit configuration of the reference-speed monitor 20. The reference-speed monitor 20 includes a replica 21 of the critical path, a delay element 22, and flip-flops 230-232. A power source voltage equal to the power source voltage fed to the target circuit 60 is fed to the replica 21 and delay element 22, and the delay time (signal propagation time) in the replica 21 and the delay time in the delay element 22 change depending on the power source voltage fed to the target circuit 60. Each of the flip-flops is driven in synchrony with the clock signal having a period equal to the period of the operational frequency fCLK required of the target circuit 60.

Flip-flop 230 receives therein the input data at a specific timing, and outputs the received data toward the replica 21. The data output from flip-flop 230 passes through the replica 21, and reaches a node 23A preceding to the delay element 22. In addition, the data passes through the replica 21 and delay element 22 to reach a node 23B succeeding to the delay element 22. Flip-flops 231 and 232 latch the data of nodes 23A and 23B, respectively, based on the operating clock signal of the target circuit 60, i.e., the clock signal fCLK having a period corresponding to the operational speed required of the target circuit 60.

The reference-speed monitor 20 latches the data of nodes 23A and 23B on flip-flops 231 and 232, respectively, at the clock subsequent to a clock at which flip-flop 230 outputs data toward the replica 21. In other words, the data of nodes 23A and 23B are latched by flip-flops 231 and 232, respectively, after a specific time length corresponding to the operational speed required of the target circuit 60 elapses since flip-flop 230 outputs the data.

If the power source voltage fed to the target circuit 60 is lower, and the signal delay time of the replica 21 is longer than the required operational speed, the data output from flip-flop 230 does not reach node 23A within a single cycle of the clock signal fCLK, whereby flip-flop 231 cannot correctly receive the data. On the other hand, if the power source voltage fed to the target circuit 60 is higher than the suitable voltage, and the signal delay time of the replica 21 is shorter compared to the required operational speed, the data output from flip-flop 230 passes through the delay element 22 to reach node 23B within a single cycle of the clock signal fCLK, whereby both flip-flops 231 and 232 can correctly latch the data. Note that the delay time of the delay element 22 corresponds to the margin with respect to the required operational speed.

If the power source voltage fed to the target circuit 60 is appropriate, and the signal delay time of the replica 21 is suitable with respect to the operational speed, the data output from flip-flop 230 passes through the replica 21 to reach node 23A within a single cycle of the clock signal fCLK. However, the data cannot pass through the delay element 22 and thus does not reach node 23B. Accordingly, in this case, only flip-flop 231 can correctly latch the data, and flip-flop 232 cannot correctly latch the data. The data latched by flip-flops 231 and 232 latched is output to the control circuit 40 as the result of monitoring the reference speed. The control circuit 40 judges whether the power source voltage fed to the target circuit 60 is lower, higher or appropriate as compared to the required operational speed, based on the monitoring result output from the reference-speed monitor 20.

Figure 3:
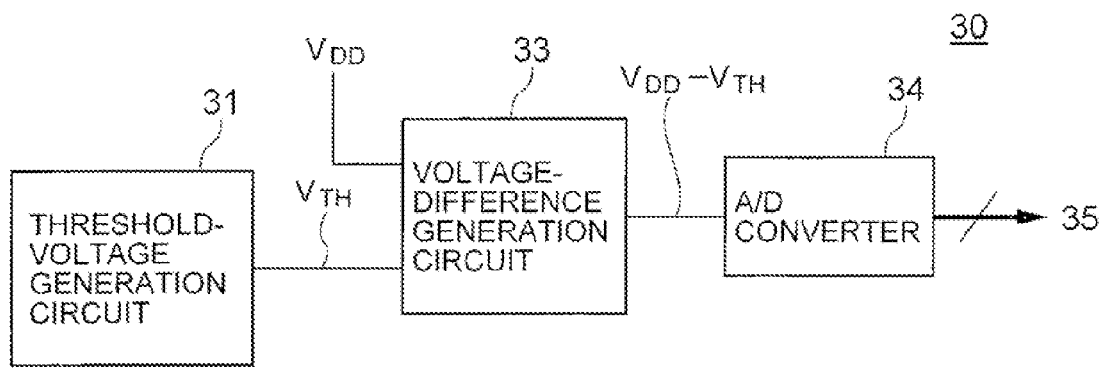
FIG. 3 is a block diagram showing the configuration of the voltage-difference monitor.

FIG. 3 shows the circuit configuration of the voltage-difference monitor 30. The voltage-difference monitor 30 includes a threshold-voltage generation circuit 31, a voltage-difference generation circuit 33, and an A/D converter 34. The voltage-difference monitor 30 outputs voltage difference information between the threshold voltage of transistors configuring the critical path of the target circuit 60 and the power source voltage of the target circuit 60. The threshold-voltage generation circuit 31 detects threshold voltage VTH of the critical path of the target circuit 60. The threshold voltage VTH recited herein means the threshold voltage of MOS transistors provided in the critical path of the target circuit 60.

Figure 4:
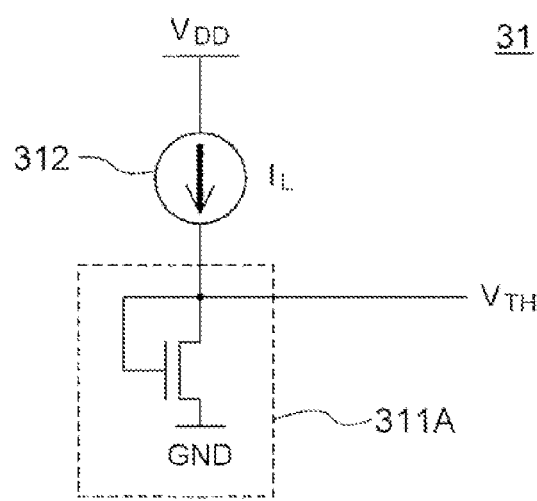
FIG. 4 is a circuit diagram showing the configuration of the threshold-voltage generation circuit.

FIG. 4 shows the concrete circuit configuration of the threshold-voltage generation circuit 31. In this example, the threshold-voltage generation circuit 31 includes a threshold-voltage generation section 311A configured by an NMOS-FET having a gate and a source connected together, and a current source 312 that applies a specific current IL. The threshold-voltage generation circuit 31 detects the gate potential of the NMOSFET upon passing of the specific current IL through the NMOSFET in threshold-voltage generation section 311A, and detects the same potential as the threshold voltage VTH.

Back to FIG. 3, the voltage-difference generation circuit 33 outputs the difference between the power source voltage VDD of the target circuit 60 and the threshold voltage VTH detected by the voltage generation circuit 31. The A/D converter 34 performs A/D conversion of the difference between the VDD and the VTH output from the voltage-difference generation circuit 33, and outputs the digitalized difference between the VDD and the VTH to the control circuit 40 as a control signal 35.

Here, the operational speed of a circuit is generally expressed, while using the power source voltage VDD and threshold voltage VTH, by the following approximation formula:

$$f = A(VDD - VTH) \qquad (1).$$

From the above formula, the change rate of the operational frequency upon changing the power source voltage is obtained as follows:

$$\frac{\partial f}{\partial V_{DD}} \cdot \frac{1}{f} = \frac{1}{V_{DD} - V_{TH}}. \qquad (2)$$

Thus, if it is assumed that the power-source-voltage control rate is:

$$\frac{\partial V_{DD}}{\partial t} = k(V_{DD} - V_{TH}), \qquad (3)$$

the change rate of the operation frequency per unit time is expressed by:

$$\frac{\partial f}{\partial t} \cdot \frac{1}{f} = k, \qquad (4)$$

where k is a constant. It is understood from the above description that the control of the power-source-voltage change rate in proportion to the VDD−VTH, if employed, can change the power source voltage, with the change rate of the clock frequency per unit time being maintained at constant.

The control circuit 40 judges, based on the monitoring result output from the reference-speed monitor 20, whether or not the delay time of the critical path of the target circuit 60 is longer, or shorter, than the required operational speed, to determine whether to increase or decrease the power source voltage of the target circuit 60. More specifically, if the data output from flip-flop 230 does not reach node 23A within a single clock cycle, it is judged that the delay time of the critical path is longer with respect to the required operational speed, and thus it is determined that the power source voltage be increased for accelerating the operational speed of the target circuit 60.

On the other hand, if both flip-flops 231 and 232 can receive the data output from flip-flop 230, the control circuit 40 judges that the delay time of the replica 21 is shorter with respect to the required operational speed, and determines that the power source voltage fed to the target circuit 60 be decreased in order to delay the operational speed of the target circuit 60. The control circuit 40 judges that the delay time of the replica 21 is within the appropriate range with respect to the required operational speed, if flip-flop 231 can correctly receive the data and flip-flop 232 cannot correctly receive the data. In this case, the control circuit 40 maintains the power source voltage of the target circuit 60 at the current value.

The control circuit 40 determines, upon determining that the power source voltage be increased or decreased, the width of the voltage (amount of voltage change) to be increased or decreased based on the control signal 35 (FIG. 3) output from the voltage-difference monitor 30. More specifically, the amount of change is determined based on the control signal 35 output from the voltage-difference monitor 30 so that the amount of voltage change per a single control (control rate of the power source voltage) assumes a value proportional to the VDD−VTH. For example, if the difference between the power source voltage VDD and the threshold voltage VTH is 0.5V, the amount of voltage change per a single control is set at 50 mV, whereas if the difference between the power source voltage VDD and the threshold voltage VTH is 0.6V, the amount of voltage change per a single control is set at 60 mV.

Figure 5:
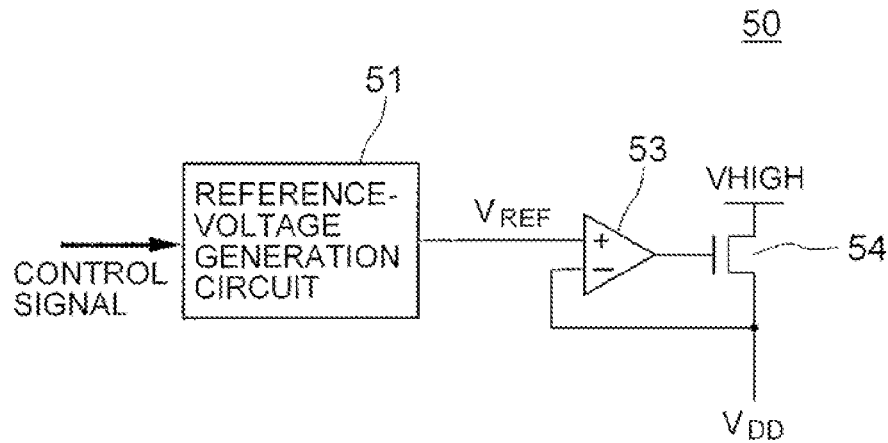
FIG. 5 is a block diagram showing the configuration of the power-source-voltage feed circuit.

FIG. 5 shows the circuit configuration of the power-source-voltage feed circuit 50. The power-source-voltage feed circuit 50 includes a reference-voltage generation circuit 51, an operational amplifier 53, and an NMOSFET 54. The reference-voltage generation circuit 51 outputs a reference voltage VREF. The voltage VREF output from the reference-voltage generation circuit 51 is input to the non-inverting input terminal of the operational amplifier 53, whereby the output voltage VDD of the power-source-voltage feed circuit 50 output from NMOSFET 54 is controlled so that VDD=VREF. The voltage VREF output from the reference-voltage generation circuit 51 is controlled based on the control signal from the control circuit 40, and the change of the reference voltage VREF changes the output voltage VDD of the power-source-voltage feed circuit 50.

Figure 6:
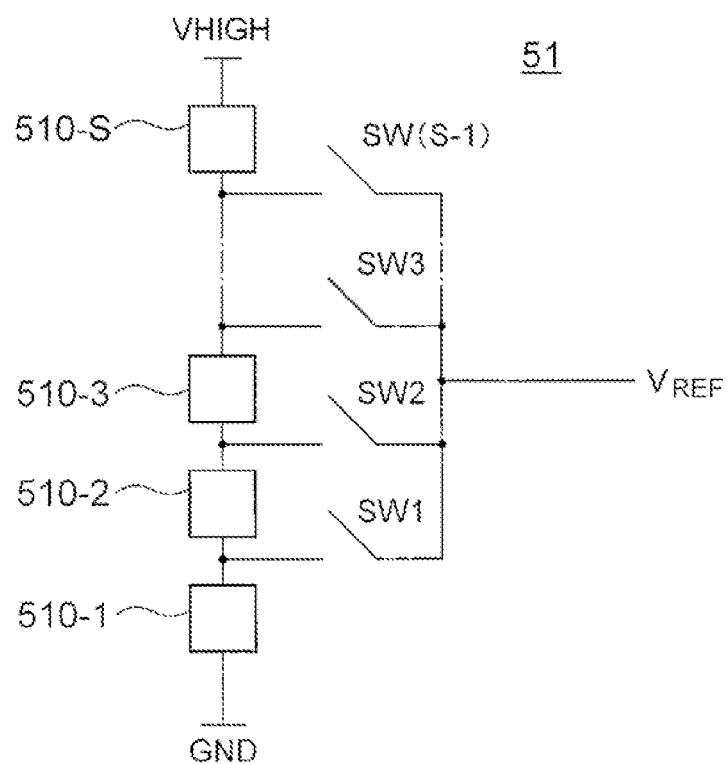
FIG. 6 is a circuit diagram showing the configuration of the reference-voltage generation circuit.

FIG. 6 shows an exemplified circuit configuration of the reference-voltage generation circuit 51. The reference-voltage generation circuit 51 includes S resistors 510-1, 510-2, ..., 510-S connected in series, and S−1 switches (SW: SW1 to SW(S−1)) inserted between a node provided between adjacent resistors and the output. The configuration is such that only one of the S−1 switches is controlled ON based on the control signal from the control circuit 40, and the voltage of the node corresponding to the ON-controlled switch is output as the reference voltage VREF.

In the present embodiment, the voltage-difference monitor 30 monitors the difference between the power source voltage and, the threshold voltage, and the amount of voltage change upon increasing or decreasing of the power source voltage of the target circuit 60 is determined based on the monitored value. In the target circuit 60, a larger difference between the power source voltage VDD and the threshold voltage VH provides a smaller change of the operational speed relative to the change of the power source voltage, whereas a smaller difference between the power source voltage VDD and the threshold voltage VH provides a larger change of the operational speed relative to the change of the power source voltage. A larger change rate of the power source voltage effected by the control circuit 40 based on a larger difference between the power source voltage VDD and the threshold voltage VTH can provide a reduction in the time length needed for controlling the power source voltage of the target circuit 60 at a suitable voltage with respect to the required operational speed, without degrading the control accuracy of the power source. In the present embodiment, the change rate of the power source voltage in proportion to the difference between the power source voltage VDD and the threshold voltage VTH enables a constant change rate of the operational frequency per unit time, whereby the accuracy of the voltage control can be maintained at a desired value irrespective of the power source voltage.

Figure 7:
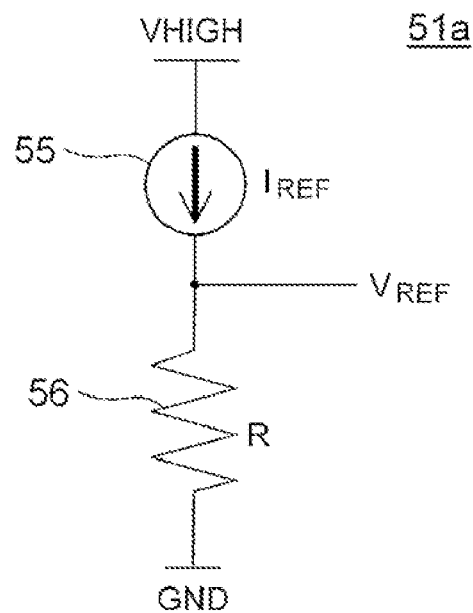
FIG. 7 is a circuit diagram showing another configuration of the reference-voltage generation circuit.

In the above description, a circuit having the configuration such as shown in FIG. 6 is used as the reference-voltage generation circuit 51, which is not limited to this example. FIG. 7 shows another exemplified configuration of the reference-voltage generation circuit. In this example, the reference-voltage generation circuit 51a is configured by a current source 55, and a variable resistor 56. Assuming that IREF and R are the current of the current source 55 and resistance of the variable resistor 56, respectively, and the node connecting together the current source 55 and variable resistor 56 has an output VREF, the VREF is expressed by VREF=IREF×R. In this configuration, the output voltage VREF of the reference-voltage generation circuit 51a is changed by the control circuit 40 changing the resistance R of the variable resistor 56.

Although an example using a series regulator shown in FIG. 5 as the power-source-voltage feed circuit 50 is described in the present embodiment, the configuration is not limited to the above example, and it is sufficient that the power-source-voltage feed circuit 50 can control the change rate of the output voltage. For example, the configuration of the power-source-voltage feed circuit is such that the output voltage thereof is controlled in accordance with the duty ratio of the clock signal, wherein the control circuit 40 controls the duty ratio of the clock signal, and the power-source-voltage feed circuit 50 controls the power source voltage.

Figure 8:
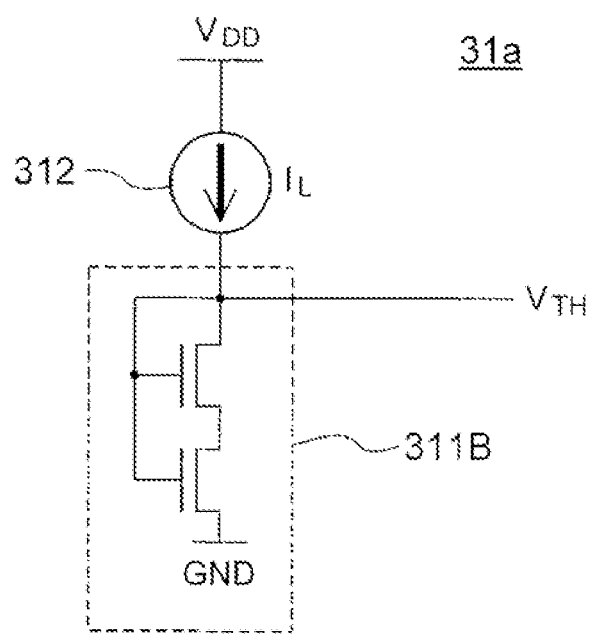
FIG. 8 is a circuit diagram showing another configuration of the threshold-voltage generation circuit.

In the above description, a threshold-voltage generation circuit 31 shown in FIG. 4 is employed as the threshold-voltage generation circuit 31; however, the threshold-voltage generation circuit 31 is not limited to the circuit configuration shown in FIG. 4. FIG. 8 shows another exemplified configuration of the threshold-voltage generation circuit. In this example, the threshold-voltage generation circuit 31*a* uses a threshold-voltage generation section 311B including stacked two MOSFETs. In the case where the speed of the critical path of the target circuit 60 is limited by a logic gate, such as a NAND, including stacked MOSFETs, the power source voltage of the target circuit 60 may be controlled using the threshold voltage output from the threshold-voltage generation circuit 31*a*, while using the threshold-voltage generation circuit 31*a* having the configuration shown in FIG. 8.

Figure 9:
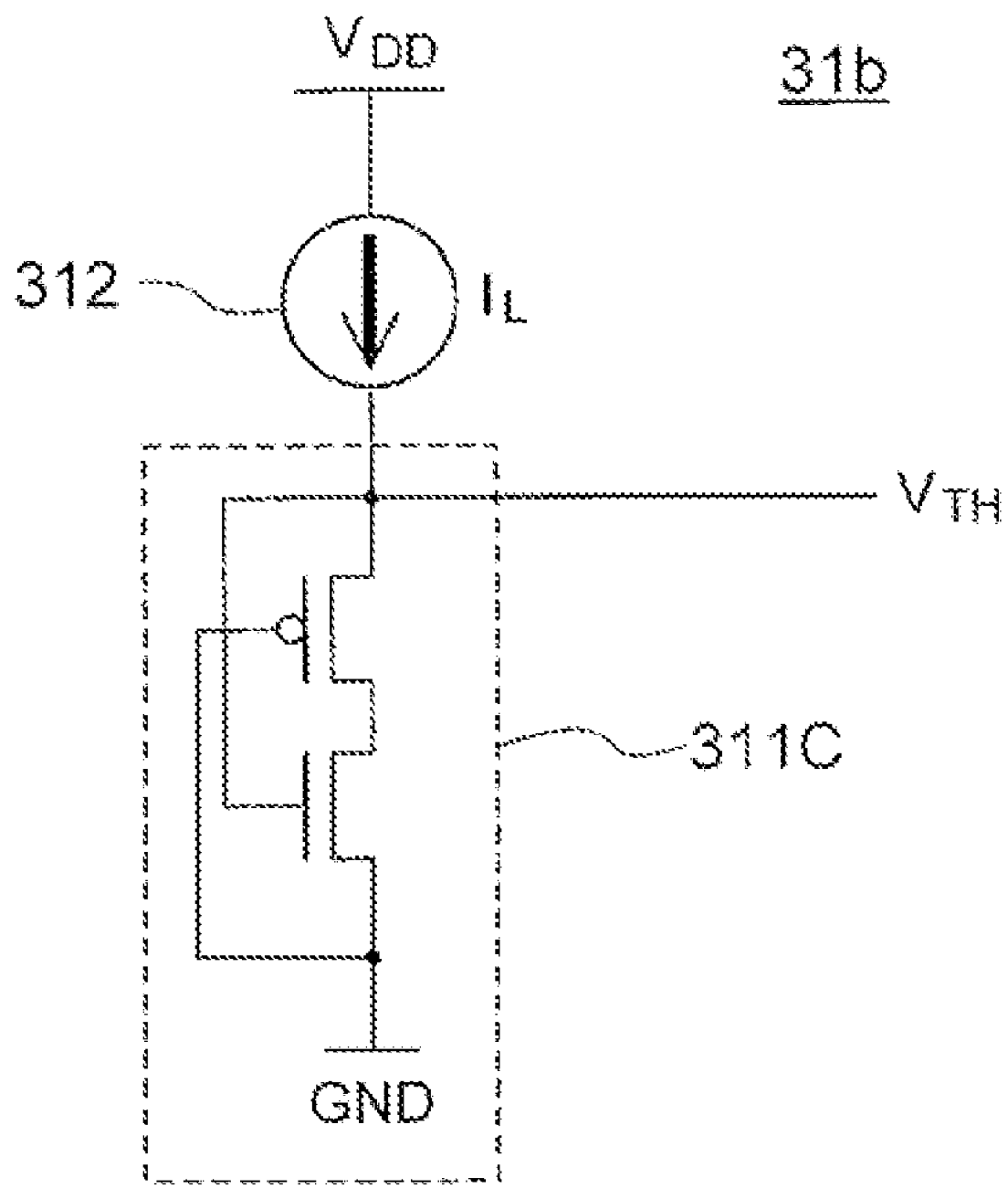
FIG. 9 is a circuit diagram showing another configuration of the threshold-voltage generation circuit.

FIG. 9 shows another exemplified configuration of the threshold-voltage generation circuit. In this example, the threshold-voltage generation circuit 31*b* uses a threshold-voltage generation section 311C including a PMOSFET and an NMOSFET. In the case where the speed of the critical path of the target circuit 60 is controlled by a PMOSFET as well as an NMOSFET, the power source voltage of the target circuit 60 may be controlled using the threshold voltage generated by the threshold-voltage generation circuit 31*b*, while using the threshold-voltage generation circuit 31*b* having the configuration shown in FIG. 9. Due to the configuration of the threshold-voltage generation section corresponding to the device that controls the critical path in this way, the control accuracy of the power source voltage can be improved.

In the above description, the difference between the voltage of the element that limits the speed of the critical path and the power source voltage of the target circuit 60 is monitored by the voltage-difference monitor 30; however, a voltage other than the voltage of the device that limits the speed of the critical path may be employed as the voltage (specific reference voltage) against which the power source voltage is compared. For example, the configuration may be such that the power source voltage dependency of the operational speed within the range of operational source voltage is obtained for the target circuit 60, the power source voltage at which the operational speed assumes zero is obtained from the power source voltage dependency (for example, the value of the power source voltage crossing the ordinate after extending the graph of the power source dependency toward the lower voltage range, with the power source voltage being the ordinate), the obtained voltage is employed as the specific reference voltage, and the voltage-difference monitor 30 monitors the difference between the specific reference voltage and the power source voltage.

Figure 10:
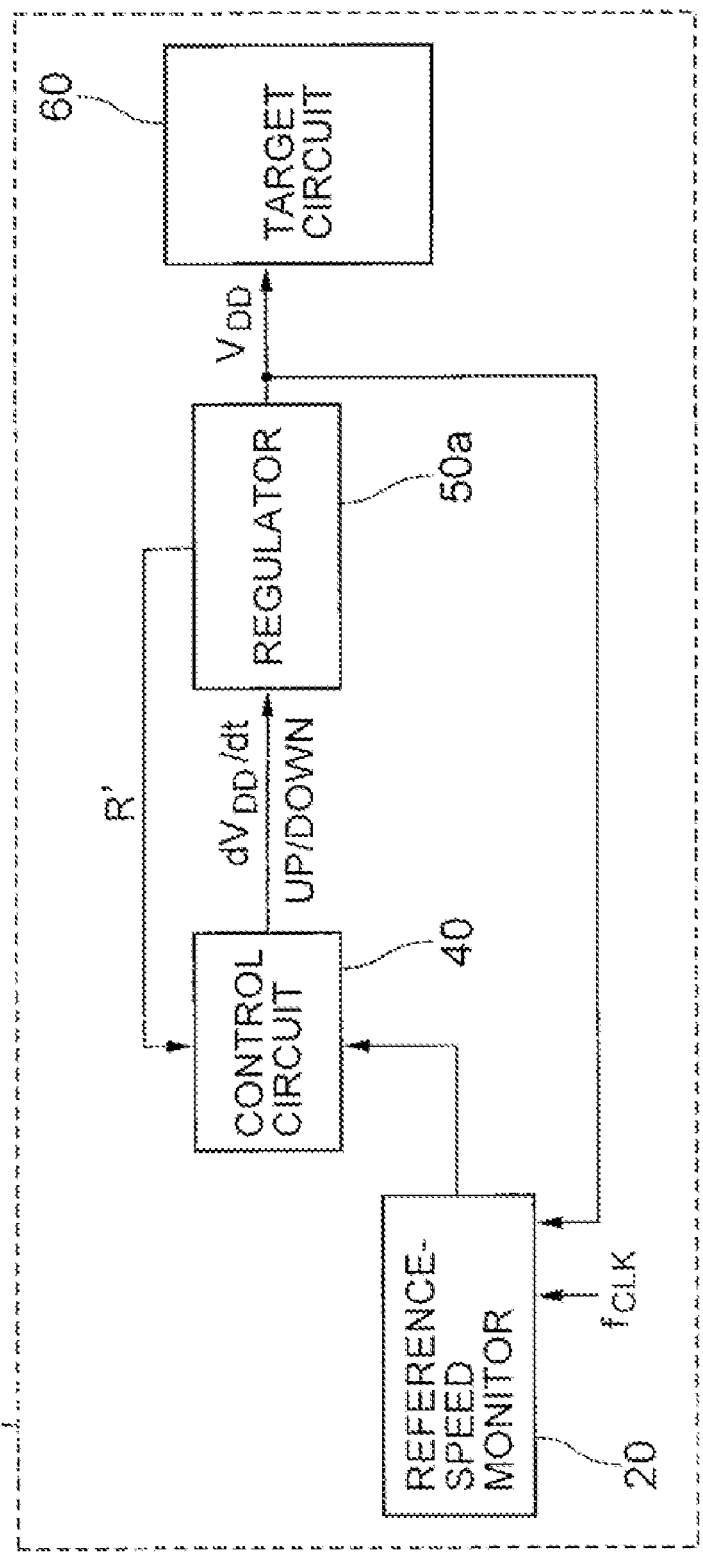
FIG. 10 is a block diagram showing the configuration of a semiconductor integrated circuit device according to a second embodiment of the present invention.

FIG. 10 shows the configuration of a semiconductor integrated circuit device according to a second embodiment of the present invention. The semiconductor integrated circuit device 10*a* of the present embodiment is such that the voltage-difference monitor 30 is excluded from the semiconductor integrated circuit device 10 of the first embodiment. The power-source-voltage feed circuit 50*a* has a basic configuration similar to that of the power-source-voltage feed circuit 50 shown in FIG. 5, and is different from the power-source-voltage feed circuit 50 of the first embodiment in the configuration of a portion of the reference-voltage generation circuit 51 shown in FIG. 5. The reference-speed monitor 20 and target circuit 60 are similar to those in the first embodiment.

Figure 11:
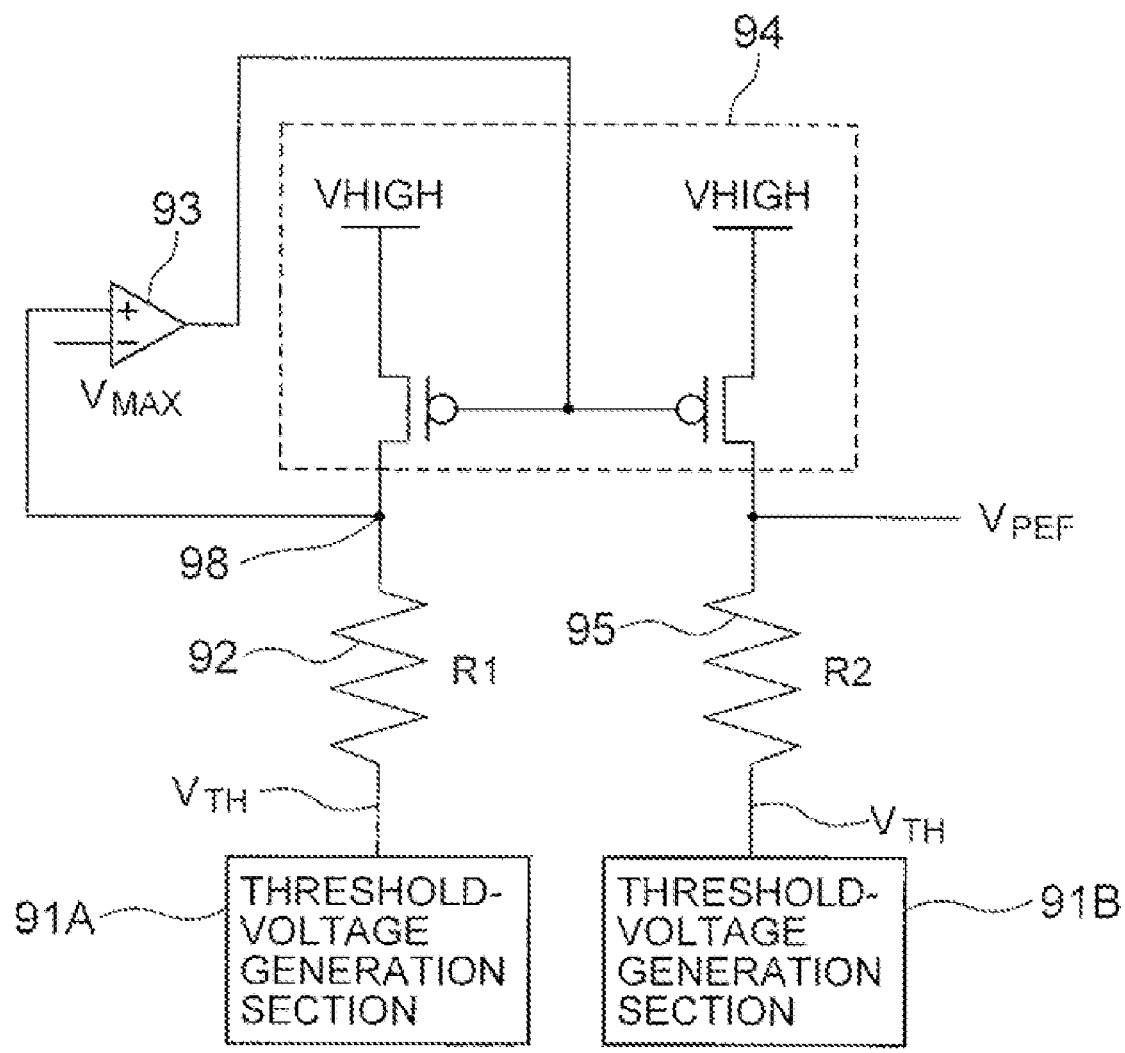
FIG. 11 is a block diagram showing the configuration of the reference-voltage generation circuit in the power-source-voltage feed circuit.

FIG. 11 shows the configuration of the reference-voltage generation circuit in the power-source-voltage feed circuit 50*a*. The reference-voltage generation circuit 51*b* includes threshold-voltage generation sections 91A and 91B, a fixed resistance 92, an operational amplifier 93, a current mirror 94, and a variable resistor 95. Note that the definition of the threshold voltage VTH of the circuit is the same as that of the threshold voltage in the first embodiment. The configuration of the threshold-voltage generation sections 91A and 91B are similar to those of the first embodiment, i.e., similar to the configuration shown in FIG. 4 or the configuration shown in FIG. 8, for example.

In the reference-voltage generation circuit 51*b*, the potential of node 98 is maintained at the potential VMAX input to the non-inverting input terminal of the operational amplifier 93 due to the feedback from the operational amplifier 93 and PMOSFET in the current mirror 94. Accordingly, the current passing through the fixed resistance 92 (R1) is set at (VMAX−VTH)/R1. At this stage, the current passing through the variable resistor 95 is equal to the current passing through the fixed resistance 92, and is (VMAX−VTH)/R1. The reference voltage VREF output as the voltage of the node connecting together the variable resistor 95 and current mirror 94 is expressed by:

$$V_{REF} = V_{TH} + \frac{R2}{R1}(V_{MAX} - V_{TH}), \tag{5}$$

where R2 is resistance of the variable resistor 95 and satisfies 0<R2≦R1. From the formula (5), a larger value of resistance R2 causes a larger value of the VREF, thereby increasing the power source voltage of the target circuit 60. The VREF assumes a maximum of VMAX if R2=R1 holds.

Rearrangement of formula (5) provides the following formula:

$$V_{REF} - V_{TH} = \frac{R2}{R1}(V_{MAX} - V_{TH}). \tag{6}$$

It is understood from formula (6) that, if resistance R2 of the variable resistor 95 is changed so that the change of resistance R2 is proportional to the present resistance R2, the power source voltage can be changed while maintaining the change rate of the operational speed, irrespective of the power source voltage, as shown in formula (3).

The direction of control of the power-source-voltage in the control circuit 40 is determined similarly to the first embodiment. More specifically, if the signal output from flip-flop 230 (FIG. 2) does not reach node 23A within a single clock cycle, it is determined that the power source voltage be increased, whereas if the signal output from flip-flop 230 reaches node 23A and node 23B, it is determined that the power source voltage be decreased. In addition, if the signal output from flip-flop 230 reaches node 23A and does not reach node 23B, it is determined that the power source voltage be maintained.

Upon increasing or decreasing the power source voltage, the control circuit 40 changes resistance R2 of the variable resistor 95 in the reference-voltage generation circuit 51*b* (FIG. 11) to increase or decrease the power source voltage. At this stage, the control circuit 40 determines that resistance R2 of the variable resistor 95 be changed in an amount of change corresponding to the value of resistance R2 before the change. More concretely, the resistance R2(t) in a t-th control is determined so that the following relationship holds:

$$R2(t) = \frac{R2(t-1)}{R1} \times \Delta R,$$

where R1 is the maximum value of resistance R2 of the variable resistor 95, and ΔR is the change width of resistance R2 when R2=R1. The control in this way provides a higher change rate of the voltage for the case of a larger resistance R2, i.e., for the case of a higher operational speed of the target circuit 60. In addition, the power source voltage can be changed while maintaining the change rate of the operational speed at a constant.

In the present embodiment, if the operational speed is higher and the change of operational speed relative to the change of power source voltage is larger, the control circuit 40 increases the change of resistance R2 of the variable resistor 95 to increase the change rate of the power source voltage, whereas if the operational speed is lower and the change of operational speed relative to the change of the power source voltage is smaller, the change rate of the power source voltage is reduced. In this way, the time length needed for the power source voltage of the target circuit 60 to reach the desired voltage can be reduced without degrading the accuracy of the power source voltage. In addition, due to the change of resistance R2 of the variable resistor 95 in proportion to the resistance before The change thereof, the change rate of the operational frequency per unit time is maintained at constant, whereby the accuracy of the voltage control can be maintained at a desired value irrespective of the power source voltage.

Figure 12:
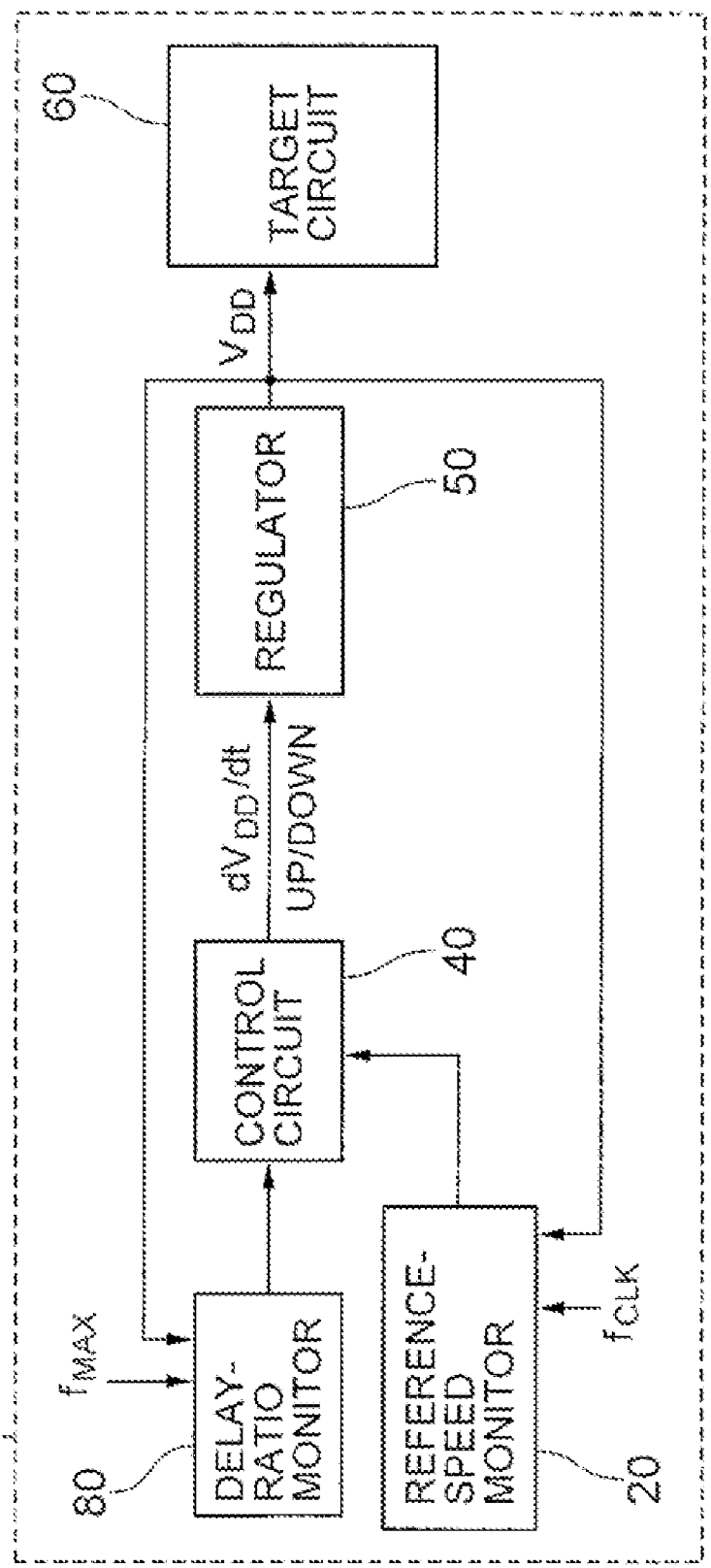
FIG. 12 is a block diagram showing the configuration of a semiconductor integrated circuit device according to a third embodiment of the present invention.

FIG. 12 shows the configuration of a semiconductor integrated circuit device according to a third embodiment of the present invention. The semiconductor integrated circuit device 10b of the present embodiment is such that the voltage-difference monitor 30 in FIG. 1 is replaced by a delay-ratio monitor 80. In the first embodiment, the control rate of the power source voltage is determined using the voltage-difference monitor 30, whereas in the present embodiment, the control rate of the power source voltage is determined using the delay-ratio monitor 8C. The reference-speed monitor 20, control circuit 40, power-source-voltage feed circuit 50, and target circuit 60 are similar to those in the first embodiment.

Figure 13:
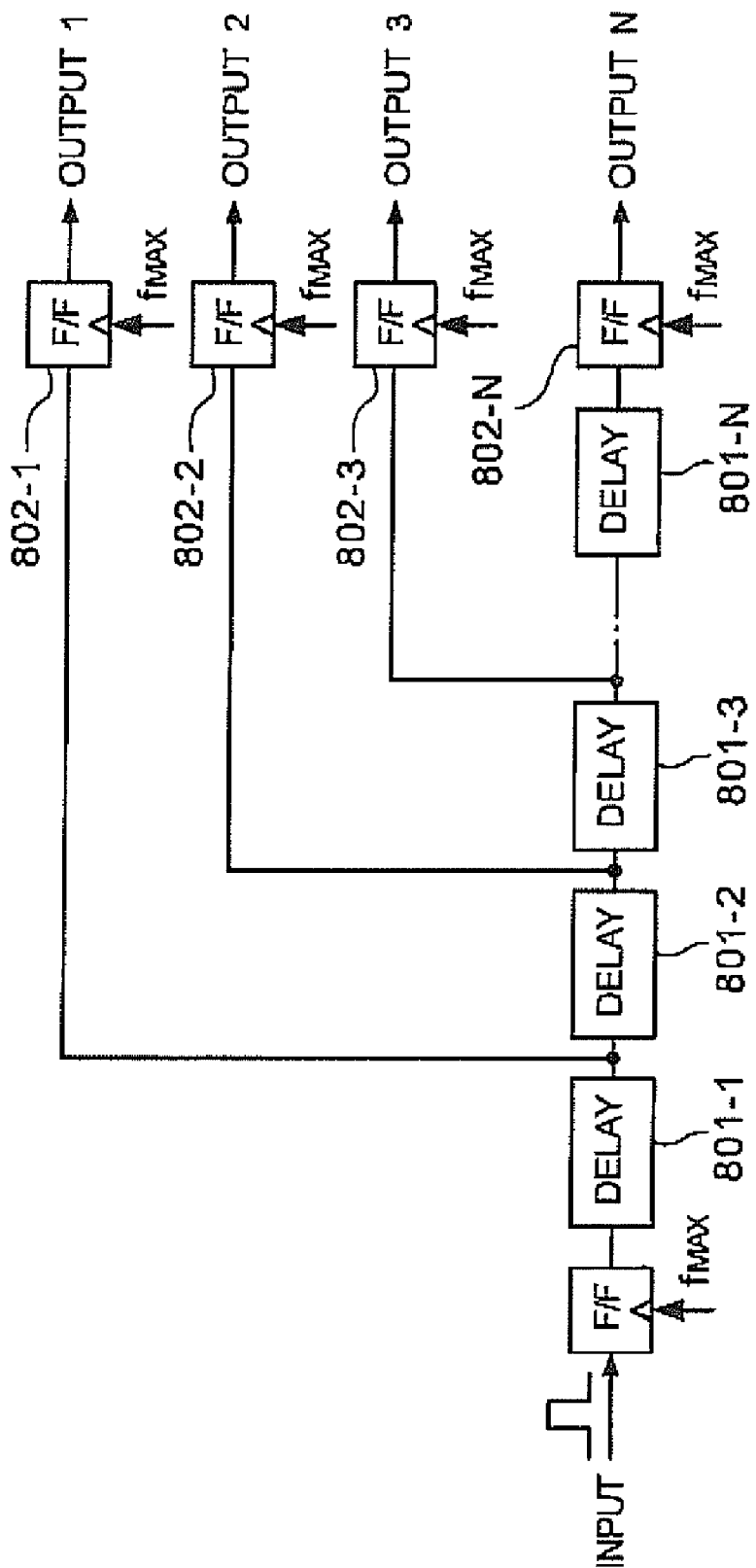
FIG. 13 is a block diagram showing the configuration of the delay-ratio monitor.

FIG. 13 shows the circuit configuration of the delay-ratio monitor 80. The delay-ratio monitor 80 includes a flip-flop 800 for data output, N delay elements 801-1 to 801-N, and N flip-flops 802-1 to 802-N that latch a signal from a node between adjacent delay gates. Each delay element 801 is fed with a power source voltage equal to the power source voltage fed to the target circuit 60, and delays the signal by a delay time corresponding to the voltage fed to the target circuit 60. The total delay time of the N delay elements 801 is set equal to the delay time of the critical path of the target circuit 60. The delay times of the delay elements 801 are equal to one another and 1/N of the delay time of the critical path.

The N flip-flops 802-1 to 802-N latch the output of delay elements 801-1 to 801-N, respectively, based on a clock signal having a period equal to the period of the maximum operational frequency fMAX required of the target circuit 60. The delay-ratio monitor 80 outputs a pulse signal (data) from flip-flop 800 at a specific clock, and receives the data of delay elements 801-1 to 801-N in flip-flop 802-1 to 802-N, respectively, at the subsequent clock. The data (potential) received by flip-flop 802-1 to 802-N are delivered to the control circuit 40 as the result of monitoring.

If the power source voltage fed to the target circuit 60 is higher and thus the target circuit 60 operates at an operational speed higher than that of the maximum operational frequency required thereof, i.e., if the delay time of the critical path is within the time length corresponding to the maximum operational frequency required of the target circuit 60, the output from flip-flop 800 reaches the final-stage flip-flop 802-N. On the other hand, if the delay time of the critical path of the target circuit 60 is longer than the time corresponding to the maximum operational frequency required of the target circuit 60, the data output from flip-flop 800 does not reach the final-stage flip-flop 802-N, and only reaches intermediate flip-flops.

It is assumed here that K is the number of flip-flops, which latched the data output from flip-flop 800, among the N flip-flops 802-1 to 802-N. The data output from flip-flop 800 reaches the delay element 801 of a later stage in the case of a higher operational speed of the target circuit 60. Thus, the value of K increases in proportion to the operational speed of the target circuit 60. Each flip-flop 802 latches the data at a timing after a single cycle of the maximum operational frequency elapsed since the data output, whereby the value of K/N represents the ratio of the present operational speed of the target circuit to the maximum operational speed of the target circuit 60.

The control circuit 40 determines based on the data output from the reference-speed monitor 20 whether to increase, decrease or maintain the power source voltage, similarly to the first embodiment. The control circuit 40, upon determining an increase or decrease of the power source voltage, determines the change amount thereof based on the number K of the flip-flops 802 in the delay ratio monitor that have latched the data output from flip-flop 800. More specifically, the control rate of the power source voltage is determined so that the control rate of the power source voltage is proportional to the number K of the flip-flops that latched the data among the N flip-flops 802, i.e., so that the control rate of the power source voltage is proportional to the ratio of the operational speed of the target circuit 60 to the maximum operational speed of the target circuit 60. At this stage, the following formula:

$$\frac{\partial V_{DD}}{\partial t} = nKf = k(V_{DD} - V_{TH}) \quad (7)$$

is obtained from formula (3). The "n" in formula (7) is a proportional constant. Accordingly, the change rate of the operational frequency per unit time can be obtained from formulas (2), (3) and (7), as follows:

$$\frac{\partial f}{\partial t} \cdot \frac{1}{f} = k. \quad (8)$$

The change rate is constant irrespective of the required speed or the power source voltage.

In the present embodiment, the delay-ratio monitor 80 monitors the ratio of the operational speed to the maximum operational speed of the target circuit 60, and based on the result of monitoring, the change rate of the power source voltage is increased if the change of the operational speed relative to the change of power source voltage is larger due to a higher operational speed of the target circuit 60, and is reduced if the change of the operational speed relative to the change of the power source voltage is smaller due to a lower operational speed of the target circuit 60. In this way, the time length needed for the power source voltage to be controlled at the desired voltage can be reduced without degrading the accuracy of the voltage control. In addition, by controlling in the delay-ratio monitor 80 the change rate of the power source voltage in proportion to the number of flip-flops that the data has reached, the change rate of the operational frequency per unit time can be maintained at constant, whereby the control accuracy of the voltage can be maintained at a desired value irrespective of the power source voltage.

Note that although each flip-flop in the delay-ratio monitor 80 in FIG. 13 is driven in synchrony with the clock signal having a period corresponding to the maximum operational frequency fMAX that is required of the target circuit 60 in the present embodiment, this clock signal may have an arbitrary frequency. However, an excessively lower frequency, if employed, may degrade the accuracy of the control rate of the power source voltage.

Figure 14:
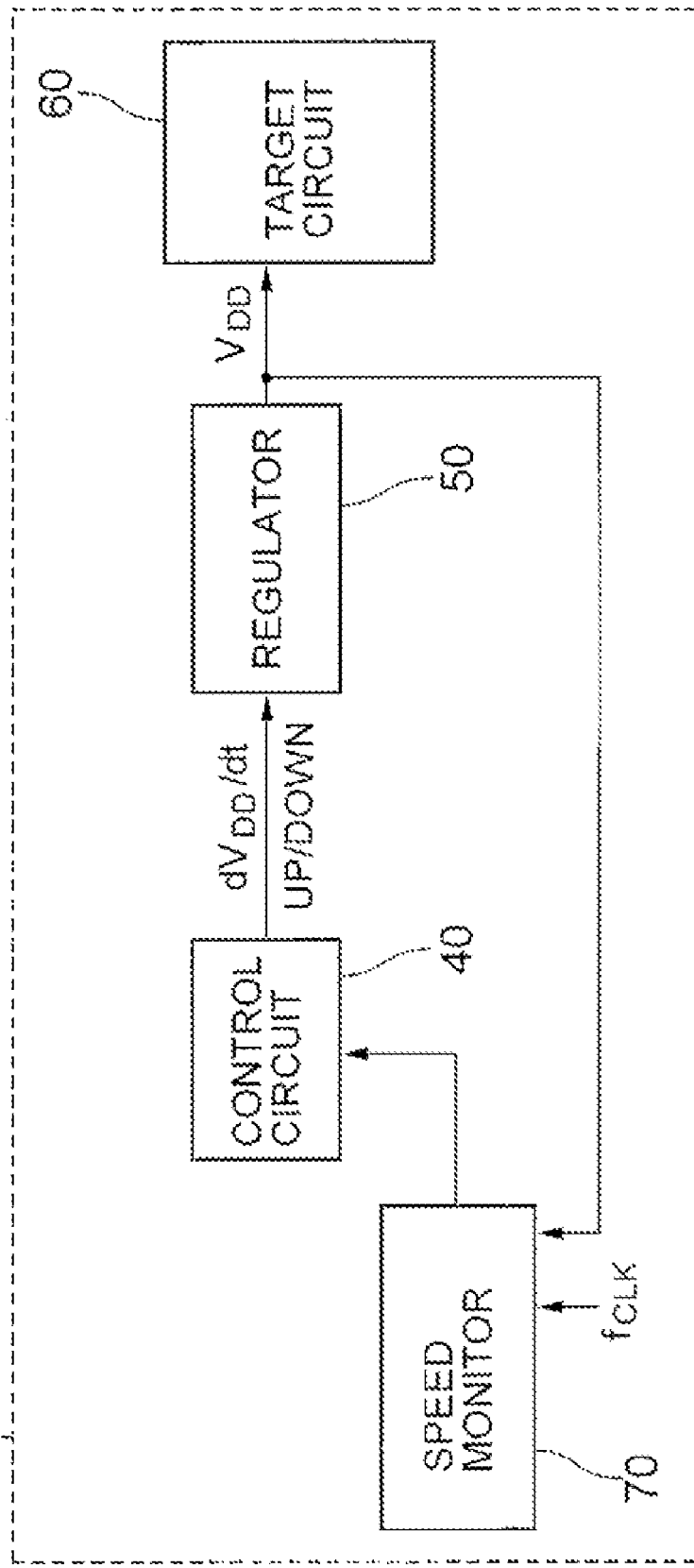
FIG. 14 is a block diagram showing the configuration of a semiconductor integrated circuit device according to a fourth embodiment of the present invention.

FIG. 14 shows the configuration of a semiconductor integrated circuit device according to a fourth embodiment of the present invention. The semiconductor integrated circuit device 10c of the present embodiment is such that the reference-speed monitor 20 and delay-ratio monitor 80 shown in FIG. 12 are united and replaced by a single speed monitor 70. In the present embodiment, the control circuit 40 determines the control direction and control rate of the power source voltage based on the result of monitoring by the speed monitor 70. The power-source-voltage feed circuit 50 and target circuit 60 are similar to those in the first embodiment.

Figure 15:
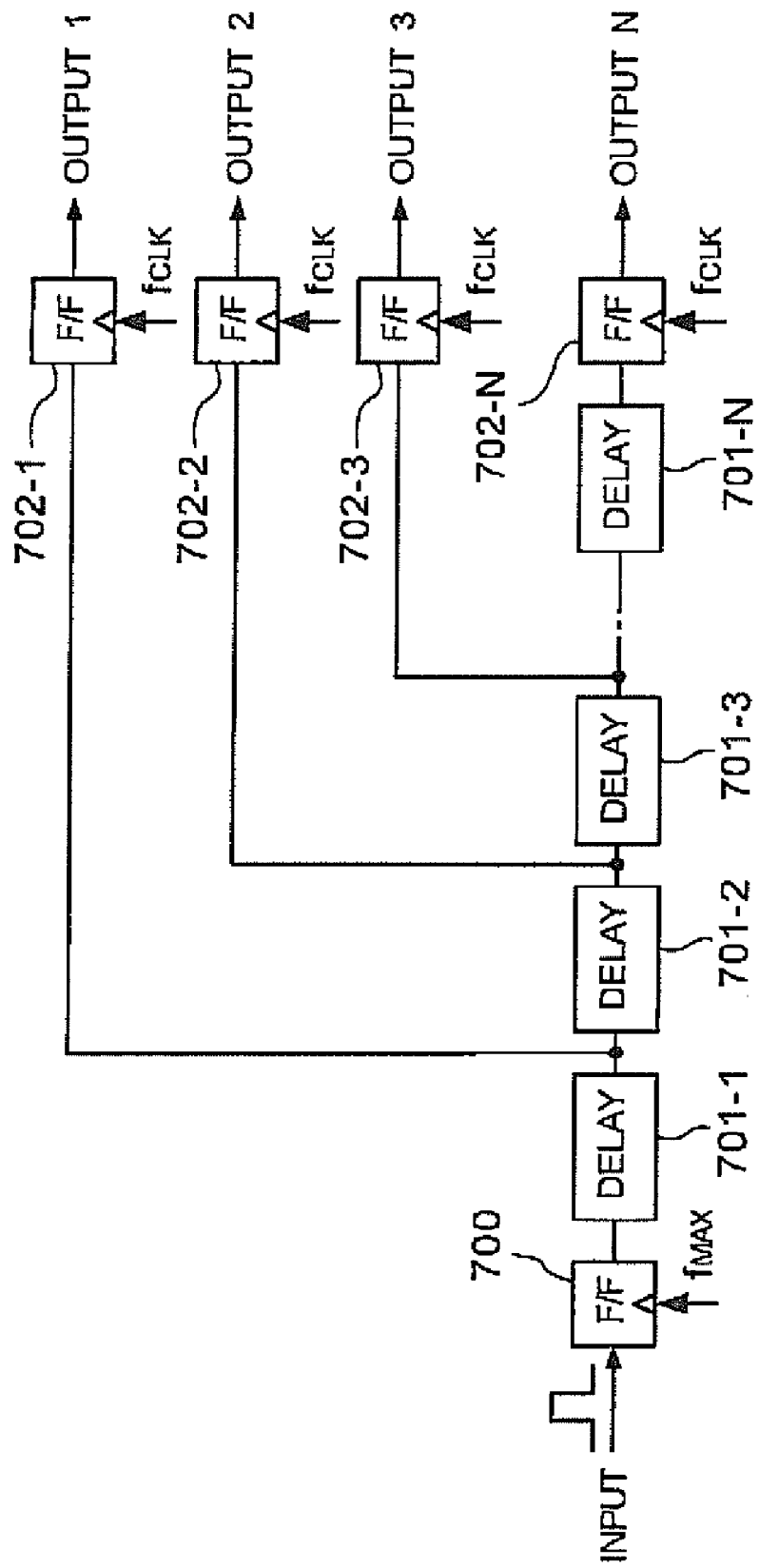
FIG. 15 is a block diagram showing the configuration of the speed monitor.

FIG. 15 shows the circuit configuration of the speed monitor 70. The circuit configuration of the speed ratio monitor 70 itself is similar to that of the delay-ratio monitor 80 shown in FIG. 13. The speed ratio monitor 70 includes a flip-flop 700 for data output, serially connected N delay elements 701-1 to 701-N, and N flip-flops 702-1 to 702-N that latch a signal on the node between adjacent flip-flops. Each of the delay elements 701 is fed with a power source voltage equal to the power source voltage fed to the target circuit 60, and delays the signal by a delay time corresponding to the voltage fed to the target circuit 60. The delay times of the delay elements 701 are equal to one another.

In the speed monitor 70, the total delay time of C delay elements among the N delay elements 701 (1≦C<N) is set equal to the delay time of the critical path of the target circuit 60. Each flip-flop 702 operates in synchrony with a clock signal having a period equal to the period of the operational frequency fCLK required of the target circuit 60. The speed monitor 70 outputs data from flip-flop 700 at a specific clock, and flip-flops 702-1 to 702-N latch the data on the output node of the delay elements 701-1 to 701-N, respectively, at a subsequent. The data latched by the flip-flops 702-1 to 702-N is delivered to the control circuit 40 as the result of monitoring.

If the operational speed of the target circuit 60 is lower than the required operational speed, and the delay time of the critical path is longer than a single period of the required operational frequency fCLK, the data output from flip-flop 700 does not reach the output node of the C-th delay element 701 as counted from the first stage side. On the other hand, if the operational speed is higher than the required operational speed, the data output from flip-flop 700 reaches a delay element 701 ahead of the C-th flip-flop as counted from the first stage side. Thus, it can be judged whether the operational speed of the target circuit is higher or not, or lower or not, based on whether or not the number of flip-flops that have latched the data is larger than C, or whether or not the number is smaller than C, with the C being used as the reference.

If the number D of the flip-flops that have latched the data among the N flip-flops 702 is smaller than C, the control circuit 40 determines that the power source voltage be increased in view of the lower operational speed. On the other hand, if the number D of the flip-flops that have latched the data is larger than C+M, with the M being a margin (M is a positive integer, satisfying C+M≦N), the control circuit 40 determines that the power source voltage be decreased in view of the higher operational speed. If the number of flip-flops that have latched the data is equal to or higher than C and less than C+M, the control circuit 40 maintains the power source voltage of the target circuit 60 at the present value.

Upon increasing or decreasing the power source voltage, the control circuit 40 determines the change rate based on the result of monitoring by the speed monitor 70, in accordance with the error of the operational speed of the target circuit 60 with respect to the required operational speed, and employs a higher change rate for a larger error. More specifically, the control circuit 40 increases the power source voltage by an incremental width that is proportional to C−D upon increasing the power source voltage (C>D), and decreases the power source voltage by a decremental width that is proportional to D−(C+M) upon decreasing the power source voltage (D>(C+M)).

In the present embodiment, the speed monitor 70 monitors whether the operational speed of the target circuit 60 is lower or higher than the required operational speed, and at the same time monitors the degree of lower or higher speed. Based on the result of monitoring, i.e., if the operational speed of the target circuit 60 is higher and the change rate of the operational speed relative to the change of power source voltage, a higher change rate of the power source voltage is employed, whereas if the operational speed of the target circuit 60 is lower and the change of the operational speed relative to the change of the power source voltage is smaller, a lower change rate is employed. In this way, the time length needed for the power source voltage to be controlled to the desired voltage can be reduced without degradation of the accuracy of the voltage control. In addition, in the present embodiment, since only a single speed monitor is needed, the overhead area can be reduced.

In the semiconductor integrated circuit device of each of the above embodiments, the control circuit changes the power source voltage fed to the target circuit in accordance with the change rate (or amount of change) corresponding to the operational speed in the target circuit. In general, the semiconductor integrated circuit device has a tendency that a higher-speed operation causes a smaller change amount of the operational speed relative to the change of the power source voltage. Thus, by increasing or decreasing the power source voltage at a higher change rate in the case of a higher operational speed, and by increasing or decreasing the power source voltage at a lower change rate in the case of a lower operational speed, i.e., depending on the operational speed, the time length needed for the power source voltage of the target circuit to be controlled to a suitable voltage without degrading the control accuracy of the power source voltage.

As described heretofore, the present invention can employ the following embodiments.

In the semiconductor integrated circuit device of the present invention, a configuration may be employed wherein the control circuit, upon increasing or decreasing the power source voltage, increases or decreases the power source voltage at a change rate corresponding to a difference between the power source voltage fed to the target circuit and a specific reference voltage determined depending on the target circuit. In this case, the specific reference voltage may be a threshold voltage of a MOS transistor that rate-limits a delay of a critical path in the target circuit, a gate-to-source voltage of the MOS transistor that is needed to pass a specific current through the MOS transistor in the target circuit, or a power source voltage that causes the operational speed to assume zero, when a power source voltage dependency of the operational speed of the target circuit within a specific range of the operation with respect to the operational speed in the semiconductor integrated circuit device. Accordingly, by changing the power source voltage fed to the target circuit at the change rate corresponding to this difference, the power source voltage fed to the target circuit can be changed at a change rate corresponding to the operational speed.

In the semiconductor integrated circuit device of the present invention, a configuration may be employed wherein the control circuit employs a higher change rate of the power source voltage for a larger voltage difference between the power source voltage fed to the target circuit and the specific reference voltage, upon increasing or decreasing the power source voltage. By judging the operational speed based on the voltage difference, and employing a higher change rate of the power source voltage for a larger voltage difference, the time length needed for controlling the power source voltage can be reduced without degrading the control accuracy of the power source voltage.

In the semiconductor integrated circuit device of the present invention, a configuration may be employed wherein the control circuit determines the change rate of the power source voltage so that the change rate of the power source voltage is proportional to a difference between the power source voltage and the specific reference voltage. In this case, the power source voltage of the target circuit can be changed while maintaining the change rate of the operational of the target circuit per unit time at a constant.

In the semiconductor integrated circuit device of the present invention, a configuration may be employed wherein the control circuit includes a voltage-difference monitor that outputs a difference between the power source voltage fed to the target circuit and the specific reference voltage as voltage difference information, and the control circuit, upon increasing or decreasing the power source voltage, determines the change rate of the power source voltage based on the voltage difference information.

In the semiconductor integrated circuit device of the present invention, a configuration may be employed wherein assuming that V1, V2, V3, R1 and R2 are the reference voltage, specific voltage higher than the reference voltage, specific reference voltage, resistance of a fixed resistance and resistance of a variable resistance, respectively, the voltage feed circuit feeds to the target circuit the power source voltage corresponding to the reference voltage V1 that satisfies:

$$V1-V3=(R2/R1)\times(V2-V3),$$

and wherein the control circuit, upon increasing or decreasing the power source voltage, increases or decreases the variable resistance R2 to change the power source voltage.

In the semiconductor integrated circuit device of the present invention, a configuration may be employed wherein the control circuit, upon increasing the resistance R2 of the variable resistor, determines the resistance R2 of the variable resistor after the change thereof at a change rate that is proportional to the resistance R2 of the variable resistor before the change thereof. By determining the resistance R2 of the variable resistor in this way, the power source voltage fed to the target circuit can be changed at a change rate proportional to the voltage difference between the power source voltage and the specific reference voltage.

In the semiconductor integrated circuit device of the present invention, a configuration may be employed wherein the control circuit, upon increasing or decreasing the power source voltage, increases or decreases the power source voltage fed by the voltage feed circuit, increases or decreases the power source voltage at a change rate corresponding to a delay time of a signal transmission path in the target circuit. In general, the delay time of the signal transmission path in the target circuit represents the operational speed of the target circuit. Accordingly, changing of the power source voltage fed to the target circuit at a change rate corresponding to the delay time of the signal transmission path in the target circuit is equivalent to the changing of the power source voltage fed to the target circuit at a change rate corresponding to the operational speed.

In the semiconductor integrated circuit device of the present invention, a configuration may be employed wherein the control circuit employs a higher change rate for a shorter delay time of the signal transmission path in the target circuit, upon increasing or decreasing the power source voltage. The delay time of the signal transmission path in the target circuit is longer for the case of a lower operational speed of the target circuit, and is shorter for the case of a higher operational speed. By judging the operational speed of the target circuit based on the delay time of the signal transmission path, to employ a higher change rate of the power source voltage of the target circuit for a shorter delay time, the time length needed for controlling the power source voltage of the target circuit can be reduced without degrading the control accuracy of the power source voltage.

The semiconductor integrated circuit device of the present invention may include a delay monitor that monitors the delay time of the signal transmission path in the target circuit, to output delay time information corresponding to the delay time of the signal transmission path, wherein the control circuit determines the change rate of the power source voltage based on the delay time information. For example, a replica that operates on the power source voltage equal to the power source voltage of the target circuit and has the same delay amount as the critical path of the target circuit is prepared in the delay monitor, to measure the delay time of the replica. By changing the power source voltage fed to the target circuit at a change rate corresponding to the delay time measured using such a replica, the power source voltage fed to the target circuit can be changed at the change rate corresponding to the operational speed.

In the semiconductor integrated circuit device of the present invention, a configuration may be employed wherein the delay time monitor: includes serially connected N delay elements (N is an integer equal to or more than two) having a total delay time corresponding to the delay of the signal transmission path in the target circuit, and N flip-flops that latch data from output nodes of the delay elements, respectively; performs data latch at each of the flip-flops after a time length corresponding to a minimum delay time of the critical path required of the target circuit is elapsed since data is input to a first-stage one of the N delay elements; and outputs data latched by the flip-flops as the delay time information. The number of nodes that the data input to the first-stage delay element reaches within a period of the minimum delay time of the critical path required of the target circuit changes depending on the operational speed of the target circuit. Accordingly, investigation of the number of flip-flops among the N flip-flops that latched the data allows judgment of the delay time of the signal transmission path in the target circuit.

In the semiconductor integrated circuit device of the present invention, a configuration may be employed wherein the control circuit determines the change rate of the power source voltage based on a number of flip-flops among the N flip-flops that correctly latched the data input to a first-stage one of the N flip-flops. Assuming that K is the number of flip-flops that latched the data among the N flip-flops, K/N represents the ratio of the present delay time of the critical path to the required minimum delay time of the critical path. A ratio nearer to "1", i.e., a value of K that is closer to the N means a higher operational speed of the target circuit. Thus, by changing the power source voltage fed to the target circuit at a change rate corresponding to the value of K, the power source voltage fed to the target circuit can be changed at a change rate corresponding to the operational speed.

In the semiconductor integrated circuit device of the present invention, a configuration may be employed wherein the control circuit determines the change rate of the power source voltage so that the change rate of the power source voltage is proportional to the number of flip-flops that correctly latched the data. In this case, the power source voltage fed to the target circuit can be changed while maintaining the change rate of the operational speed the target circuit per unit time at a constant.

The semiconductor integrated circuit device of the present invention may include a reference-speed monitor circuit that monitors a relationship between a reference speed required of the target circuit and an operational speed of the target circuit, wherein the control circuit controls the power source voltage based on a result of monitoring by the reference-speed monitor circuit so that the operational speed of the target circuit is not lower than the reference speed and not higher by a specific value than the reference speed. In this case, a configuration may be employed wherein the control circuit determines to increase the power source voltage when the operational speed of the target circuit (60) is lower than the reference speed, determines to decrease the power source voltage when the operational speed is higher by the specific value than the reference speed, and determines to maintain the power source voltage when the operational speed is not lower than the reference speed and not lower by the specific value the reference speed.

In the semiconductor integrated circuit device of the present invention, a configuration may be employed wherein the reference-speed monitor circuit includes a replica that transmits a signal at a time delay corresponding to the delay time of the critical path in the target circuit, a delay circuit that is serially connected to the replica, a first flip-flop that latches data from a node connecting together the replica and the delay circuit, a second flip-flop that latches data from an output node of the delay circuit, latches data in the first and second flip-flops after a time length corresponding to the reference speed is elapsed since the data is input to the replica, and outputs the data latched in the first and second flip-flops as a result of monitoring of the reference speed and operational speed. In this case, a configuration may be employed where in the control circuit determines to increase the power source voltage when the data latched in the first flip-flop does not coincide with the data output to the replica, determines to maintain the power source voltage increase when the data latched in the first flip-flop coincides the data output to the replica and the data latched in the second flip-flop does not coincide with the data output to the replica, and determines to decrease the power source voltage when the data latched in the first and second flip-flops coincides with the data output to the replica.

In the semiconductor integrated circuit device of the present invention, a configuration may be employed wherein the control circuit determines the change rate of the power source voltage upon increasing or decreasing the power source voltage fed by the voltage feed circuit based on a difference between a reference operational speed required of the target circuit and the operational speed of the target circuit. If the difference between the operational speed of the target circuit and the reference operational speed required thereof is larger, the difference between the power source voltage fed to the target circuit and the appropriate power source voltage is larger, whereby the control accuracy of the voltage may be lower. On the other hand, if the difference between the operational speed of the target circuit and the reference operational speed required thereof is smaller, the difference between the power source voltage fed to the target circuit and the appropriate power source voltage is smaller, whereby it is needed to employ a relatively higher control accuracy of the voltage. A higher change rate of the power source voltage is employed for the case where the difference between the operational speed of the target circuit and the reference operational speed required thereof is larger, if the difference is employed, or for the case where the ratio therebetween is apart from "1", if the ratio is employed. Thereby, the time length needed for the power source voltage to be controlled to the appropriate voltage is reduced, while improving the control accuracy of the voltage in the vicinity of the appropriate voltage.

The semiconductor integrated circuit device of the present invention may include a speed monitor that monitors a delay time of a signal transmission path in the target circuit, to output speed information corresponding to a delay time of the signal transmission path, and the control circuit determines the change rate of the power source voltage based on the speed information.

In the semiconductor integrated circuit device of the present invention, a configuration may be employed wherein the speed monitor: includes serially connected N delay elements (N is an integer not smaller than two) that include C delay elements (C<N) having a total delay time equivalent to the delay time of the critical path in the target circuit, and N flip-flops that latch data from output nodes of the delay elements, respectively; perform data latch in the flip-flops after a time length corresponding to the operational speed required of the target circuit is elapsed since the data is input to a first-stage one of the N delay elements; and outputs data latched in the flip-flops as the speed information. If the operational speed of the target circuit is lower than the required operational speed, the number of flip-flop among the N flip-flops that can latch the data is less than C. In this case, the operational speed is increased by increasing the power source voltage at a change rate corresponding to the deviation with respect to the reference operational speed. On the contrary, if the operational speed of the target circuit is higher than the required reference operational speed, the number of flip-flops among the N flip-flops that can latch the data is larger than C. In this case, i.e., if the number of flip-flops that have latched the data is larger than C, the power source voltage is lowered at a change rate corresponding to the deviation with respect to the reference operational speed, whereby the operational speed is maintained not to largely exceed the required speed.

In the semiconductor integrated circuit device of the present invention, a configuration may be employed wherein assuming that D is the number of flip-flops among the N flip-flops that correctly latched the data output to the first-stage one of the delay elements, the control circuit increases the power source voltage at the change rate corresponding to C−D if D<C holds. In the semiconductor integrated circuit device of the present invention, a configuration may be employed wherein assuming that D is the number of flip-flops among the N flip-flops that correctly latched the data output to the first-stage one of the delay elements, the control circuit maintains the power source voltage if C<D<C+M holds. In the semiconductor integrated circuit device of the present invention, a configuration may be employed wherein assuming that D is the number of flip-flops among the N flip-flops that correctly latched data output to the first-stage one of the delay elements, the control circuit decreases the power source voltage at a changing rate of D−(C+M) if D>C+M holds, given M being a specific positive integer. Note that the value of M corresponds to a margin for the control of power source voltage.

While the invention has been described with reference to preferable embodiments thereof, the semiconductor integrated circuit device of the present invention is not limited to the above embodiments and a variety of modifications and alterations of the embodiments will fall within the scope of the present invention.

This application is based upon and claims the benefit of priority from Japanese patent application No. 2007-033450 filed on Feb. 14, 2007, the disclosure of which is incorporated herein in its entirety by reference.

The invention claimed is:

1. A semiconductor integrated circuit device comprising:
a target circuit;
a voltage feed circuit that feeds a power source voltage to said target circuit;
a control circuit that controls the power source voltage fed by said voltage feed circuit,
wherein said control circuit increases or decreases the power source voltage, which said voltage feed circuit feeds to said target circuit, at a change rate corresponding to an operational speed in said target circuit,
wherein said control circuit increases or decreases the power source voltage at a change rate corresponding to a difference between the power source voltage fed to said target circuit and a specific reference voltage that is determined depending on said target circuit.

2. The semiconductor integrated circuit device according to claim 1, wherein the specific reference voltage is a threshold voltage of a MOS transistor that rate-limits a critical path delay in said target circuit.

3. The semiconductor integrated circuit device according to claim 1, wherein the specific reference voltage is a gate-to-source voltage of a MOS transistor that is needed to pass a specific current through said MOS transistor in said target circuit.

4. The semiconductor integrated circuit device according to claim 1, wherein the specific reference voltage is a power source voltage that causes the operational speed to assume zero, when a power source voltage dependency of the operational speed of said target circuit within a specific range of the operational speed is extrapolated to a specific range of the power source voltage.

5. The semiconductor integrated circuit device according to claim 1, wherein said control circuit employs a higher change rate of the power source voltage for a larger voltage difference between the power source voltage fed to said target circuit and the specific reference voltage, upon increasing or decreasing the power source voltage.

6. The semiconductor integrated circuit device according to claim 1, wherein said control circuit determines the change rate of the power source voltage so that the change rate of the power source voltage is proportional to a difference between the power source voltage and the specific reference voltage.

7. The semiconductor integrated circuit device according to claim 1, wherein said control circuit includes a voltage-difference monitor that outputs a voltage difference between the power source voltage fed to said target circuit and the specific reference voltage, and said control circuit determines the change rate of the power source voltage based on the voltage difference.

8. The semiconductor integrated circuit device according to claim 1, wherein assuming that V1, V2, V3, R1 and R2 are the reference voltage, specific voltage higher than the reference voltage, specific reference voltage, resistance of a fixed resistance and resistance of a variable resistance, respectively, said voltage feed circuit feeds to said target circuit the power source voltage corresponding to the reference voltage V1 that satisfies:

$$V1-V3=(R2/R1)\times(V2-V3),$$

and wherein said control circuit increases or decreases the variable resistance R2 to change the power source voltage.

9. The semiconductor integrated circuit device according to claim 8, wherein said control circuit, upon increasing the resistance R2 of said variable resistor, determines the resistance R2 of said variable resistor after the change thereof at a change rate that is proportional to the resistance R2 of said variable resistor before the change thereof.

10. The semiconductor integrated circuit device according to claim 1, further comprising a reference-speed monitor circuit that monitors a relationship between a reference speed required of said target circuit and an operational speed of said target circuit, wherein said control circuit controls the power source voltage based on a result of monitoring by said reference-speed monitor circuit so that the operational speed of said target circuit is not lower than the reference speed and not higher by a specific value than the reference speed.

11. The semiconductor integrated circuit device according to claim 10, wherein said control circuit determines to increase the power source voltage when the operational speed of said target circuit is lower than the reference speed, determines to decrease the power source voltage when the operational speed is higher by the specific value than the reference speed, and determines to maintain the power source voltage when the operational speed is not lower than the reference speed and not lower by the specific value than the reference speed.

12. The semiconductor integrated circuit device according to claim 10, wherein said reference-speed monitor circuit includes a replica that transmits a signal at a time delay corresponding to the delay time of the critical path in said target circuit, a delay circuit that is serially connected to said replica, a first flip-flop that latches data from a node connecting together said replica and said delay circuit, a second flip-flop that latches the data from an output node of said delay circuit, latches data in said first and second flip-flops after a time length corresponding to the reference speed is elapsed since the data is input to said replica, and outputs the data latched in said first and second flip-flops as a result of monitoring of the reference speed and operational speed.

13. The semiconductor integrated circuit device according to claim 12, wherein said control circuit determines to increase the power source voltage when the data latched in said first flip-flop does not coincide with the data output to said replica, determines to maintain the power source voltage increase when the data latched in said first flip-flop coincides the data output to said replica and the data latched in said second flip-flop does not coincide with the data output to said replica, and determines to decrease the power source voltage when the data latched in said first and second flip-flops coincides with the data output to said replica.

14. A semiconductor integrated circuit device comprising:
a target circuit;
a voltage feed circuit that feeds a power source voltage to said target circuit;
a control circuit that controls the power source voltage fed by said voltage feed circuit,
wherein said control circuit increases or decreases the power source voltage, which said voltage feed circuit feeds to said target circuit, at a change rate corresponding to an operational speed in said target circuit,
wherein said control circuit increases or decreases the power source voltage at a change rate corresponding to a delay time of a signal transmission path in said target circuit,
wherein said control circuit employs a higher change rate for a shorter delay time of said signal transmission path in said target circuit, upon increasing or decreasing the power source voltage.

15. The semiconductor integrated circuit device according to claim 14, further comprising a delay monitor that monitors the delay time of said signal transmission path in said target circuit, to output delay time information corresponding to the delay time of said signal transmission path, wherein said control circuit determines the change rate of the power source voltage based on the delay time information.

16. A semiconductor integrated circuit device comprising:
a target circuit;
a voltage feed circuit that feeds a power source voltage to said target circuit;
a control circuit that controls the power source voltage fed by said voltage feed circuit,
wherein said control circuit increases or decreases the power source voltage, which said voltage feed circuit feeds to said target circuit, at a change rate corresponding to an operational speed in said target circuit,
wherein said control circuit increases or decreases the power source voltage at a change rate corresponding to a delay time of a signal transmission path in said target circuit,
wherein the semiconductor integrated circuit device further comprises a delay monitor that monitors the delay time of said signal transmission path in said target circuit, to output delay time information corresponding to the delay time of said signal transmission path, wherein said control circuit determines the change rate of the power source voltage based on the delay time information,
wherein said delay time monitor: includes serially connected N delay elements (N is an integer equal to or more than two) having a total delay time corresponding to the delay of said signal transmission path in said target circuit, and N flip-flops that latch data from output nodes of said delay elements, respectively; performs data latch at each of said flip-flops after a time length corresponding to a minimum delay time of said critical path required of said target circuit is elapsed since data is input to a first-stage one of said N delay elements; and outputs data latched by said flip-flops as said delay time information.

17. The semiconductor integrated circuit device according to claim 16, wherein said control circuit determines the change rate of the power source voltage based on a number of flip-flops among said N flip-flops that correctly latched the data input to a first-stage one of said N flip-flops.

18. The semiconductor integrated circuit device according to claim 17, wherein said control circuit determines the change rate of the power source voltage so that the change rate of the power source voltage is proportional to the number of flip-flops that correctly latched the data.

19. A semiconductor integrated circuit device comprising:
a target circuit;
a voltage feed circuit that feeds a power source voltage to said target circuit;
a control circuit that controls the power source voltage fed by said voltage feed circuit,
wherein said control circuit increases or decreases the power source voltage, which said voltage feed circuit feeds to said target circuit, at a change rate corresponding to an operational speed in said target circuit,
wherein said control circuit determines the change rate of the power source voltage upon increasing or decreasing the power source voltage fed by said voltage feed circuit based on a difference between a reference operational speed required of said target circuit and the operational speed of said target circuit,
wherein the semiconductor integrated circuit device further comprises a speed monitor that monitors a delay time of a signal transmission path in said target circuit, to output speed information corresponding to a delay time of the signal transmission path, and said control circuit determines the change rate of the power source voltage based on the speed information,
wherein said speed monitor: includes serially connected N delay elements (N is an integer not smaller than two) that include C delay elements (C<N) having a total delay time equivalent to the delay time of the critical path in said target circuit, and N flip-flops that latch data from output nodes of said delay elements, respectively; perform data latch in said flip-flops after a time length corresponding to the operational speed required of said target circuit is elapsed since the data is input to a first-stage one of said N delay elements; and outputs data latched in said flip-flops as said speed information.

20. The semiconductor integrated circuit device according to claim 19, wherein assuming that D is the number of flip-flops among said N flip-flops that correctly latched the data output to the first-stage one of said delay elements, said control circuit increases the power source voltage at the change rate corresponding to C−D, if D<C holds.

21. The semiconductor integrated circuit device according to claim 19, wherein assuming that D is the number of flip-flops among said N flip-flops that correctly latched the data output to the first-stage one of said delay elements, said control circuit maintains the power source voltage, if C<D<C+M holds.

22. The semiconductor integrated circuit device according to claim 19, wherein assuming that D is the number of flip-flops among said N flip-flops that correctly latched data output to the first-stage one of said delay elements, said control circuit decreases the power source voltage at a change rate corresponding to D−(C+M) if D>C+M holds, given M being a specific positive integer.

* * * * *